(12) United States Patent
Ono et al.

(10) Patent No.: US 8,722,206 B2
(45) Date of Patent: May 13, 2014

(54) ORGANIC LIGHT-EMITTING DIODE

(75) Inventors: Tomio Ono, Yokohama (JP); Shintaro Enomoto, Yokohama (JP); Isao Takasu, Komae (JP); Yukitami Mizuno, Tokyo (JP); Shuichi Uchikoga, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 644 days.

(21) Appl. No.: 12/876,632

(22) Filed: Sep. 7, 2010

(65) Prior Publication Data
US 2011/0057180 A1      Mar. 10, 2011

(30) Foreign Application Priority Data
Sep. 10, 2009   (JP) .................................. 2009-209529

(51) Int. Cl.
*H01L 51/52*   (2006.01)
(52) U.S. Cl.
USPC ............ 428/690; 428/917; 313/504; 313/506
(58) Field of Classification Search
None
See application file for complete search history.

(56) References Cited

U.S. PATENT DOCUMENTS

| | | | |
|---|---|---|---|
| 6,034,206 A * | 3/2000 | Yamamoto et al. | 528/397 |
| 8,053,092 B2 * | 11/2011 | Miki et al. | 428/690 |
| 2001/0020085 A1 * | 9/2001 | Ueda et al. | 528/425 |
| 2003/0068528 A1 * | 4/2003 | Thompson et al. | 428/690 |
| 2003/0091862 A1 | 5/2003 | Tokito et al. | |
| 2005/0236614 A1 * | 10/2005 | Parker | 257/40 |
| 2005/0249972 A1 * | 11/2005 | Hatwar et al. | 428/690 |
| 2006/0246315 A1 * | 11/2006 | Begley et al. | 428/690 |
| 2007/0069197 A1 | 3/2007 | Leclerc | |
| 2008/0286607 A1 * | 11/2008 | Nomura et al. | 428/690 |
| 2009/0045726 A1 * | 2/2009 | Miki et al. | 313/504 |
| 2010/0123389 A1 | 5/2010 | Takasu et al. | |

FOREIGN PATENT DOCUMENTS

| | | |
|---|---|---|
| JP | 2004-288380 A | 10/2004 |
| JP | 2006-128636 A | 5/2006 |

OTHER PUBLICATIONS

Enomoto et al., Digest of Technical Papers—Society for Information Display International Symposium (2009), 40(Bk 2), pp. 695-698 (Jun. 2009).*
Translation for Kita et al. (JP 2004-288380; publication date Oct. 2004).*
Japanese Office Action issued Aug. 21, 2012 in Patent Application No. 2009-209529 with English Translation.
Chinese Office Action issued Aug. 1, 2012 in Patent Application No. 2010102757060 with English Translation.
Isao Takasu et al., "Improvement in Triplet Excition Confinement of Electrophosphorescent Device Using Fluorinated Polymer Host", Proc. of SPIE vol. 7415, Aug. 20, 2009, pp. 74150B-1-74150B-8.
Franky SO, et al., "Recent progress in solution processable organic light emitting devices", Journal of Applied Physics, vol. 102, 091101, 2007, 21 pages.

(Continued)

*Primary Examiner* — Dawn L. Garrett
(74) *Attorney, Agent, or Firm* — Oblon, Spivak, McClelland, Maier & Neustadt, L.L.P.

(57) ABSTRACT

According to one embodiment, an organic light-emitting diode includes an anode and a cathode arranged apart from each other, an emission layer, arranged between the anode and cathode, containing a host material of polyvinyl(2,7-difluorocarbazole), a blue-emitting phosphorescent material, and an electron transport material, and a hole transport layer of polyvinylcarbazole arranged adjacent to the emission layer on an anode side.

6 Claims, 2 Drawing Sheets

(56) References Cited

OTHER PUBLICATIONS

Chinese Office Action issued Feb. 22, 2013 in Patent Application No. 201010275706.0 with English Translation.
Ying GenYu et al., "Flat Panel Display Technology", People's Posts and Telecommunications Press, $1^{st}$ edition, p. 344, paragraphs 2-3, ISBN 7-115-10342-9/TN•1890, Oct. 2002, 2 pages.
Huang ChunHui et al., "Introduction to Organic Light-Emitting Materials and Devices", Fudan University Press, $1^{st}$ edition, p. 120, section 4.2, ISBN 7-309-04642-0/O•345, Sep. 2005, 2 pages.
Office Action issued Mar. 11, 2013, in Taiwanese Patent Application No. 099129912 with English translation.
U.S. Appl. No. 12/875,478, filed Sep. 3, 2010, Sugi, et al.
U.S. Appl. No. 14/045,133, filed Oct. 3, 2013, Ono, et al.

* cited by examiner

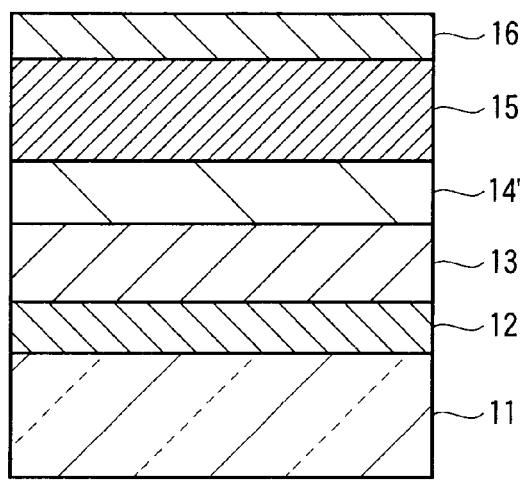
F I G. 2
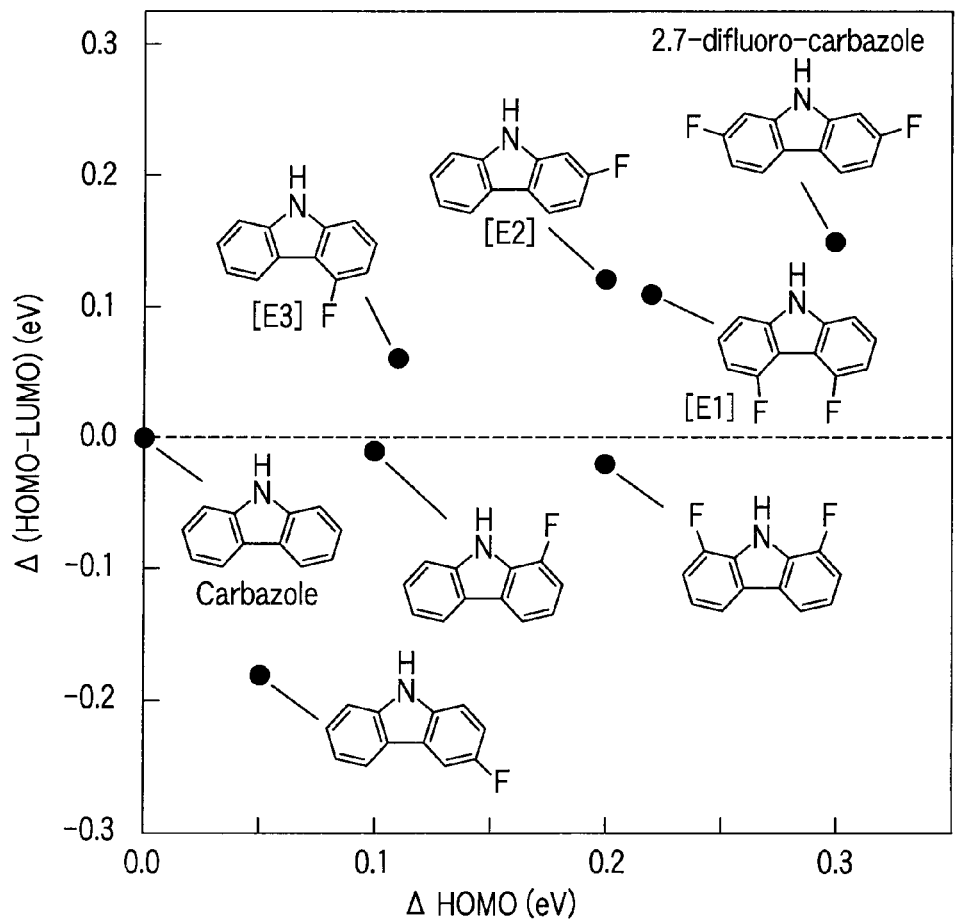
F I G. 3

ORGANIC LIGHT-EMITTING DIODE

CROSS-REFERENCE TO RELATED APPLICATIONS

This application is based upon and claims the benefit of priority from Japanese Patent Application No. 2009-209529, filed Sep. 10, 2009; the entire contents of which are incorporated herein by reference.

FIELD

Embodiments described herein relate generally to an organic light-emitting diode.

BACKGROUND

In recent years, organic light-emitting diodes have been attracting attention for application to a planar light source and the like. In particular, organic light-emitting diodes utilizing phosphorescence have been actively studied since they exhibit higher luminous efficiency.

There are two types of methods for producing such organic light-emitting diodes; a method using a vacuum evaporation process and a method using a coating process. The method using the coating process enables increase in device area and cost reduction; however, it has been still strongly expected to improve the luminous efficiency.

Conventionally, J. Appl. Phys., 102, 091101 (2007), for example, describes luminous efficiency of an organic light-emitting diode produced with use of a coating process. For example, it discloses an organic light-emitting diode having a structure in which, on a glass substrate, an anode of ITO, a hole injection layer of PEDOT:PSS, an emission layer comprising a host material polyvinylcarbazol (PVK), a phosphorescent blue-emitting material FIrpic, and an electron transport material OXD-7, and a cathode of CsF/Al are formed in this order. The organic light-emitting diode aims to obtain higher luminous efficiency by using PVK with higher triplet energy among host materials, for which a coating process can be applied, in order to confine the triplet excited state of the phosphorescent blue-emitting material FIrpic. However, the efficiency of the organic light-emitting diode is not still satisfactory.

BRIEF DESCRIPTION OF THE DRAWINGS

FIG. 2 is a cross-sectional view of an organic light-emitting diode according to a second embodiment; and FIG. 3 is a diagram showing properties of low-molecular-weight fluorinated carbazoles.

DETAILED DESCRIPTION

In general, according to one embodiment, there is provided an organic light-emitting diode including: an anode and a cathode arranged apart from each other; an emission layer, arranged between the anode and cathode, containing a host material of polyvinyl(2,7-difluorocarbazole), a blue-emitting phosphorescent material, and an electron transport material; and a hole transport layer of polyvinylcarbazole arranged adjacent to the emission layer on an anode side.

According to another embodiment, there is provided an organic light-emitting diode including: an anode and a cathode arranged apart from each other; an emission layer, arranged between the anode and cathode, containing a host material of polyvinyl(2,7-difluorocarbazole), a blue-emitting phosphorescent material, and an electron transport material; and a hole transport layer of fluorinated polyvinylcarbazole other than polyvinyl(2,7-difluorocarbazole) arranged adjacent to the emission layer on an anode side.

Considering application of a host material with higher triplet energy than that of PVK in order to increase the luminous efficiency of an organic light-emitting diode produced by using a coating process, we found polyvinyl(2,7-difluorocarbazole) (hereinafter, abbreviated as F-PVK) as such a host material.

On the other hand, F-PVK has a deep HOMO level and thus holes are hard to be injected. In order to increase the luminous efficiency, a hole transport layer having a HOMO level which is between those of the emission layer and the anode (or the hole injection layer) is preferably inserted adjacent to the emission layer on the anode side. Such a hole transport layer is formed of polyvinylcarbazole (PVK) or fluorinated polyvinyl carbazoles other than polyvinyl(2,7-difluorocarbazole).

Since, for example, the HOMO level of PVK is between that of PEDOT:PSS, which is commonly used for a hole injection layer of the organic light-emitting diode produced by using a coating process, and that of F-PVK, holes can be injected from the hole injection layer of PEDOT:PSS into the host material F-PVK of the emission layer through the hole transport layer of PVK. Additionally, since the LUMO level of PVK is shallower than that of F-PVK, it enables to prevent electrons from passing through the host material (F-PVK) of the emission layer without light emission. Further, owing to the higher triplet energy of PVK, excitons can be prevented from being transported from the emission layer toward the anode.

Also in the case where fluorinated polyvinylcarbazole other than polyvinyl(2,7-difluorocarbazole) is used as the hole transport layer instead of PVK, a similar effect can be provided.

Therefore, the organic light-emitting diode of the embodiments can be produced by a coating process and enables improvement of the luminous efficiency.

Embodiments are described below with reference to the drawings.

First Embodiment

Figure 1A:
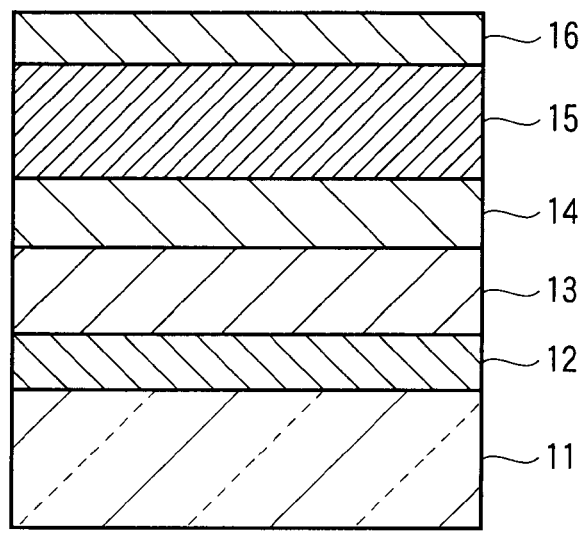
FIG. 1A is a cross-sectional view of an organic light-emitting diode according to a first embodiment.
Figure 1B:
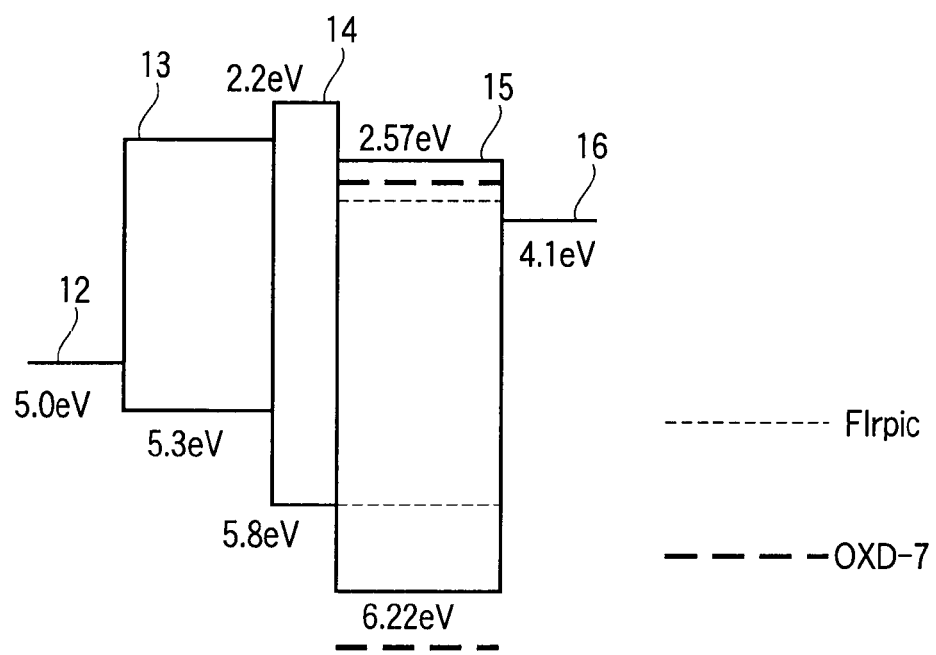
FIG. 1B is an energy band diagram thereof.

FIG. 1A is a cross-sectional view of an organic light-emitting diode according to the first embodiment, and FIG. 1B is an energy band diagram thereof.

On a glass substrate 11, an anode 12 of ITO is formed. An aqueous solution of poly(ethylenedioxythiophene):poly(styrenesulfonic acid) [PEDOT:PSS] is applied to the anode 12 and dried to form a hole injection layer 13. A solution of polycarbazole [PVK] in an organic solvent such as xylene is applied to the hole injection layer 13 and dried to form a hole transport layer 14. A solution, prepared by dissolving 60% by weight of polyvinyl(2,7-difluorocarbazole) [F-PVK] as a host material, 10% by weight of [iridium (III) bis(4,6-difluorophenyl)-pyridinato-N,C2']picolinate [FIrpic] as a phosphorescent blue-emitting material, which is also called as a guest material or emissive dopant), and 30% by weight of 1,3-bis [(4-tert-butylphenyl)-1,3,4-oxadiazolephenylene [OXD-7] as an electron transport material in an organic solvent such as toluene is applied to the hole transport layer 14 and dried to form an emission layer 15. A cathode 16 of CsF/Al is formed on the emission layer 15.

The following are chemical formulae of the hole transport material PVK forming the hole transport layer 14, and the host material F-PVK, the phosphorescent blue-emitting material FIrpic and the electron transport material OXD-7, which are contained in the emission layer 15.

Hole transport material: polyvinylcarbazole [PVK]

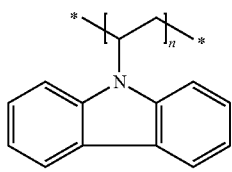

Host material: polyvinyl(2,7-difluorocarbazole) [F-PVK]

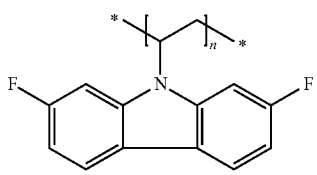

Phosphorescent blue-emitting material: [iridium (III) bis (4,6-difluorophenyl)pyridinato-N,C2']picolinato [FIrpic]

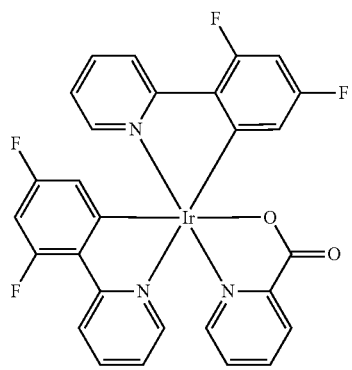

Electron transport material: 1,3-bis[4-tert-butylphenyl]-1,3,4-oxadiazolephenylene [OXD-7]

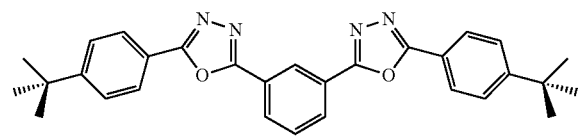

When a voltage is applied, holes are injected from the anode 12 through the hole injection layer 13 and the hole transport layer 14 into the host material F-PVK of the emission layer 15 and electrons are injected from the cathode 16 into the host material F-PVK of the emission layer 15, where holes and electrons are recombined to form excitons. The excitons are then energy-transferred to the guest material FIrpic thereby emitting blue light. Alternatively, holes and electrons are directly recombined on the guest material FIrpic to form excitons thereby emitting blue light.

As shown in FIG. 1B, the band gap of the host material [F-PVK] of the emission layer 15 is broader than that of the hole transport layer 14 [PVK]. The triplet energy of F-PVK has been recognized as being higher than that of PVK. Accordingly, use of F-PVK as the host material of the emission layer 15 enables efficient confinement of the triplet excited state of the guest material FIrpic, which is advantageous for providing higher luminous efficiency.

Moreover, the HOMO level (5.8 eV) of PVK of the hole transport layer 14 is between the HOMO level (5.3 eV) of the PEDOT:PSS commonly used for the hole injection layer of the organic light-emitting diode produced with use of a coating process and the HOMO level (6.22 eV) of the host material F-PVK of the emission layer 15, and therefore the holes can be efficiently injected into the host material [F-PVK] of the emission layer 15 from the hole injection layer 13 [PEDOT:PSS] through the hole transport layer 14 [PVK].

Further, since the LUMO level (2.2 eV) of the hole transport layer 14 [PVK] is shallower than the LUMO level (2.57 eV) of the host material [F-PVK] of the emission layer 15, the electrons can be prevented from passing through the host material [F-PVK] of the emission layer 15 without light emission. In addition, since PVK of the hole transport layer 14 has a higher triplet energy level, the excitons can also be prevented from being transported from the emission layer 15 toward the cathode 12. In particular, we confirmed that, when FIrpic and OXD-7 are mixed in the emission layer 15, the recombination of electrons and holes occurs mainly on the cathode side of the emission layer 15. Therefore, the structure of this embodiment, in which the hole transport layer 14 which enables to block the transport of the excitons is formed on the cathode side of the emission layer 15, is advantageous for providing higher luminous efficiency.

As described above, the organic light-emitting diode of the first embodiment can be produced by using a coating process and enables improvement of luminous efficiency.

Second Embodiment

FIG. 2 is a cross-sectional view of the organic light-emitting diode according to the second embodiment. The members of the organic light-emitting diode in this embodiment corresponding to those of the first embodiment are indicated by the same reference numerals and the explanation thereof is omitted.

In the organic light-emitting diode of the second embodiment, a hole transport layer 14' of fluorinated polyvinylcarbazole other than F-PVK is used instead of the hole transport layer 14 of PVK in the first embodiment.

With reference to FIG. 3, properties of low-molecular-weight fluorinated carbazoles are described below. It should be noted that fluorinated polyvinylcarbazole prepared by polymerizing fluorinated vinylcarbazole having the fluorinated carbazole indicated in FIG. 3 also exhibits similar tendency as that of the low-molecular-weight fluorinated carbazole. The horizontal axis of the figure, ΔHOMO (eV), indicates the depth of the HOMO level of the fluorinated carbazole relative to that of the unsubstituted carbazole. The vertical axis of the figure, Δ(HOMO-LUMO), indicates how wide the band gap (HOMO-LUMO) of the fluorinated carbazole compared to that of the unsubstituted carbazole.

As described above, the hole transport material used for the hole transport layer is desirably provided with the three properties below.

(1) In order to facilitate electron injection, the HOMO level of the hole transport material is preferably between that of the hole injection layer 13 [PEDOT:PSS] and that of the host material [F-PVK] of the emission layer 15.

(2) In order to prevent the electrons from passing through the host material [F-PVK] of the emission layer 15, the LUMO level of the hole transport material is preferably shallower than that of the host material [F-PVK].

(3) In order to prevent excitons from being transported toward the anode 12 from the emission layer 15, the hole transport material has higher triplet energy. In general, the higher triplet energy corresponds to a broader band gap.

The fluorinated carbazoles indicated in FIG. 3 with Δ(HOMO-LUMO) smaller than 0 are undesirable since they are disadvantageous with respect to the above requirement (3). In contrast, the fluorinated carbazoles E1-E3 indicated in FIG. 3 with Δ(HOMO-LUMO) larger than 0, where 2,7-difluorocarbazole is excluded, are desirable since they satisfy the above requirements (1) to (3). These fluorinated carbazoles are [E1] 4,5-difluorocarbazole, [E2] 1-fluorocarbazole, and [E3] 4-fluorocarbazole.

As described above, the corresponding fluorinated polyvinylcarbazoles also indicate similar tendency as shown in FIG. 3. Therefore, the fluorinated polyvinylcarbazoles preferably used as the hole transport material includes polyvinyl(4,5-difluorocarbazole), polyvinyl(1-fluoroocarbazole), and polyvinyl(4-fluorocarbazole). The organic light-emitting diode employing such fluorinated polyvinylcarbazole which satisfies the above requirements (1) to (3) can be produced by using a coating process and enables to improve the luminous efficiency.

Other Embodiments

In the above embodiments, the case where FIrpic is used as a phosphorescent blue-emitting material has been described, but it is not limited thereto. As the phosphorescent blue-emitting material, those represented by the following chemical formulae can be also used.

Bis(2,4-difluorophenylpyridinato)tetrakis(1-pyrazolyl)borate iridium III

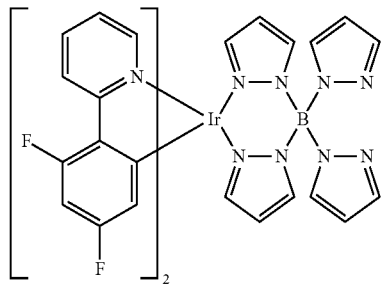

Platinum (III) [2(4,6-difluorophenyl)pyridinato-N,C2]-(acetyl acetonate)

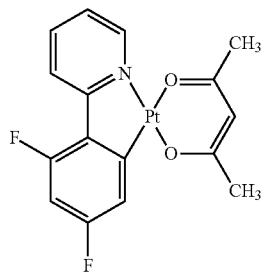

Tris(2-(2,4-difluorophenyl)pyridine)iridium (III)

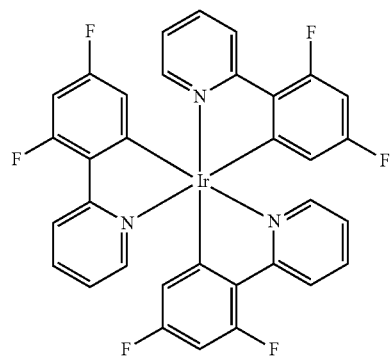

In the above embodiments, the case where OXD-7 is used as the electron transport material has been described, but it is not limited thereto. As the electron transport material, those represented by the following chemical formulae can be also used.

Tris(2,4,6-trimethyl-3-(pyridine-3-yl)phenyl)borane

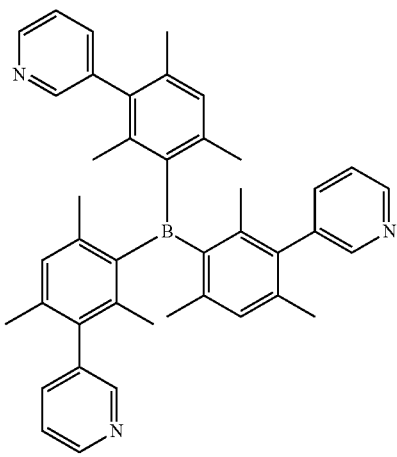 [SMILES: Cc1cc(C)c(-c2cccnc2)c(C)c1B(c1c(C)cc(C)c(-c2cccnc2)c1C)c1c(C)cc(C)c(-c2cccnc2)c1C]

2,9-Dimethyl-4,7-diphenyl-1,10-phenanhroline

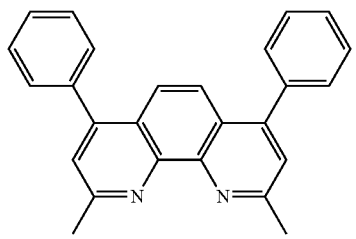 [SMILES: Cc1cc(-c2ccccc2)c2ccc3c(-c4ccccc4)cc(C)nc3c2n1]

2-(4-Biphenylyl)-5-(4-tert-butylphenyl)-1,3,4-oxadiazole

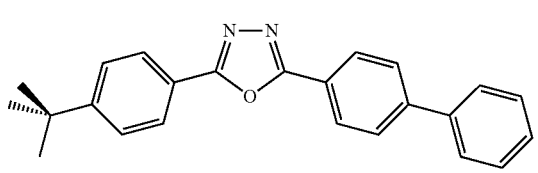

3-(4-Biphenylyl)-4-phenyl-5-tert-butylphenyl-1,2,4-triazole

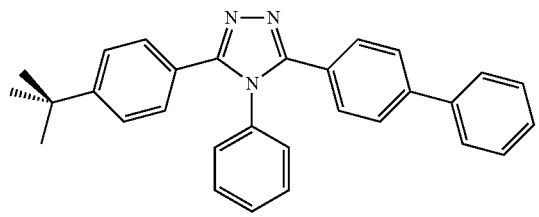

In the above embodiments, the case where the emission layer contains FIrpic alone as a guest material and emits blue light has been described, but it is not limited thereto. For example, an emission layer emitting white light may be formed, which comprises 60% by weight of F-PVK as the host material, 30% by weight of OXD-7 as the electron transport material, 10% by weight of FIrpic as the phosphorescent blue-emitting material, and 0.2% by weight of bis(2-(9,9-dihexylfluorenyl)-1-pyridine)(acetylacetonate) iridium (III) of the following chemical formula as a phosphorescent yellow-emitting material.

Phosphorescent yellow-emitting material: Bis(2-(9,9-dihexyl-fluorenyl)-1-pyridine)(acetylacetonate) iridium (III)

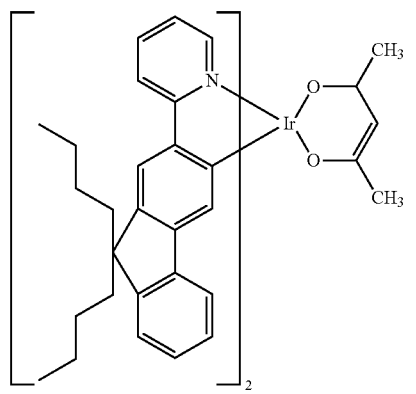

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An organic light-emitting diode comprising:
   an anode and a cathode arranged apart from each other;
   an emission layer, arranged between the anode and cathode, comprising a host material of polyvinyl(2,7-difluorocarbazole), a blue-emitting phosphorescent material, and an electron transport material; and
   a hole transport layer comprising at least one fluorinated carbazole selected from the group consisting of polyvinyl(4,5-difluorocarbazole), polyvinyl(1-fluorocarbazole), or polyvinyl(4-fluorocarbazole) arranged adjacent to the emission layer on an anode side.

2. The organic light-emitting diode of claim 1, wherein the hole transport layer comprises polyvinyl(4,5-difluorocarbazole).

3. The organic light-emitting diode of claim 1, wherein the hole transport layer comprises polyvinyl(1-fluorocarbazole).

4. The organic light-emitting diode of claim 1, wherein the hole transport layer comprises polyvinyl(4-fluorocarbazole).

5. The organic light-emitting diode of claim 1, wherein the blue-emitting material is at least one selected from the group consisting of [iridium (III) bis(4,6-difluorophenyl)pyridinato-N,C2']picolinato [FIrpic]

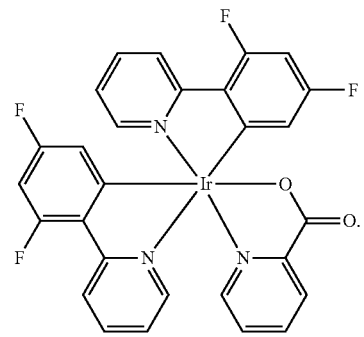

Bis(2,4-difluorophenylpyridinato)tetrakis(1-pyrazolyl)borate iridium III

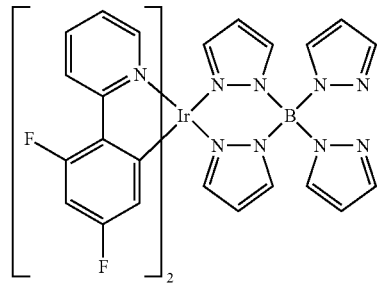

Platinum (III) [2(4,6-difluorophenyl)pyridinato-N,C2]-(acetyl acetonate)

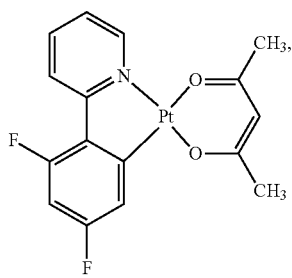

and
Tris(2-(2,4-difluorophenyl)pyridine)iridium (III)
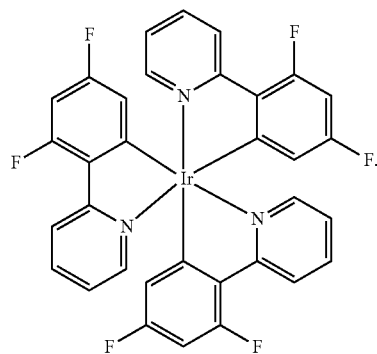
6. The organic light-emitting diode of claim 1, further comprising Bis(2-(9,9-dihexyl-fluorenyl)-1-pyridine)(acetylacetonate) iridium (III) as a phosphorescent yellow-emitting material:
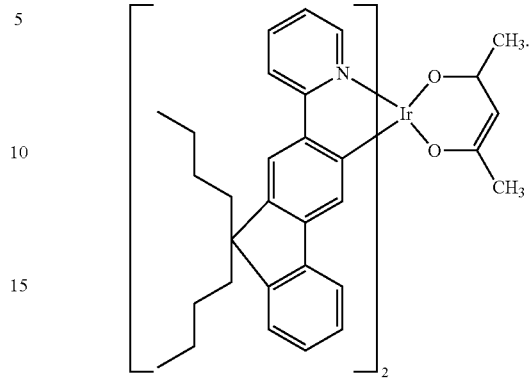
* * * * *